United States Patent
Hasegawa et al.

(10) Patent No.: US 10,923,315 B2
(45) Date of Patent: Feb. 16, 2021

(54) CHARGED PARTICLE BEAM APPARATUS, AND METHOD OF ADJUSTING CHARGED PARTICLE BEAM APPARATUS

(71) Applicant: Hitachi High-Tech Corporation, Tokyo (JP)

(72) Inventors: Masaki Hasegawa, Tokyo (JP); Tomohiko Ogata, Tokyo (JP); Noriyuki Kaneoka, Tokyo (JP); Hisaya Murakoshi, Tokyo (JP); Katsunori Onuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/487,551

(22) PCT Filed: Mar. 24, 2017

(86) PCT No.: PCT/JP2017/011907
§ 371 (c)(1),
(2) Date: Aug. 21, 2019

(87) PCT Pub. No.: WO2018/173241
PCT Pub. Date: Sep. 27, 2018

(65) Prior Publication Data
US 2019/0378685 A1    Dec. 12, 2019

(51) Int. Cl.
*H01J 37/20* (2006.01)
*H01J 37/26* (2006.01)
(Continued)

(52) U.S. Cl.
CPC ............ *H01J 37/265* (2013.01); *H01J 37/20* (2013.01); *H01J 37/12* (2013.01); *H01J 37/14* (2013.01); *H01J 37/263* (2013.01)

(58) Field of Classification Search
CPC .......... H01J 37/265; H01J 37/20; H01J 37/14; H01J 37/12; H01J 37/263
(Continued)

(56) References Cited

U.S. PATENT DOCUMENTS

| 7,288,948 B2 | 10/2007 | Hasegawa et al. |
| 2003/0127593 A1 | 7/2003 | Shinada et al. |

(Continued)

FOREIGN PATENT DOCUMENTS

| JP | 2003-202217 A | 7/2003 |
| JP | 2004-227888 A | 8/2004 |

(Continued)

OTHER PUBLICATIONS

International Search Report (PCT/ISA/210) issued in PCT Application No. PCT/JP2017/011907 dated Jul. 25, 2017 with English translation (five pages).

(Continued)

*Primary Examiner* — Michael Maskell
(74) *Attorney, Agent, or Firm* — Crowell & Moring LLP

(57) ABSTRACT

A purpose of the present invention is to provide a charged particle beam apparatus that performs apparatus adjustment based on a proper evaluation of a beam. To achieve the abovementioned purpose, with the present invention, proposed is a charged particle beam apparatus comprising: an irradiation optical system including a lens for converging charged particle beams emitted from a charged particle source; and an imaging optical system for imaging the charged particles obtained by irradiating the charged particle beams toward a sample on an imaging element, wherein the charged particle beam apparatus comprises a control apparatus for controlling the lens, and the control apparatus evaluates for each lens condition the size of a specific brightness area obtained by the charged particle beam being (Continued)

made to reach the sample, and selects the lens condition for which the size information fulfills a designated condition.

11 Claims, 7 Drawing Sheets

(51) Int. Cl.
*H01J 37/14* (2006.01)
*H01J 37/12* (2006.01)

(58) Field of Classification Search
USPC ...... 250/306, 307, 310, 311, 396 R, 396 ML
See application file for complete search history.

(56) References Cited

U.S. PATENT DOCUMENTS

| | | | | |
|---|---|---|---|---|
| 2004/0031921 | A1* | 2/2004 | Kondo | H01J 37/265 250/311 |
| 2005/0139772 | A1* | 6/2005 | Hasegawa | H01J 37/29 250/311 |
| 2006/0289804 | A1 | 12/2006 | Knippelmeyer et al. | |
| 2013/0320209 | A1* | 12/2013 | Shichi | H01J 37/261 250/307 |
| 2014/0124666 | A1* | 5/2014 | Sasaki | H01J 37/26 250/310 |

FOREIGN PATENT DOCUMENTS

| | | |
|---|---|---|
| JP | 2005-181246 A | 7/2005 |
| JP | 2007-513460 A | 5/2007 |
| JP | 2008-98191 A | 4/2008 |
| JP | 4253576 B2 | 4/2009 |

OTHER PUBLICATIONS

Japanese-language Written Opinion (PCT/ISA/237) issued in PCT Application No. PCT/JP2017/011907 dated Jul. 25, 2017 (three pages).

* cited by examiner

[FIG. 1]
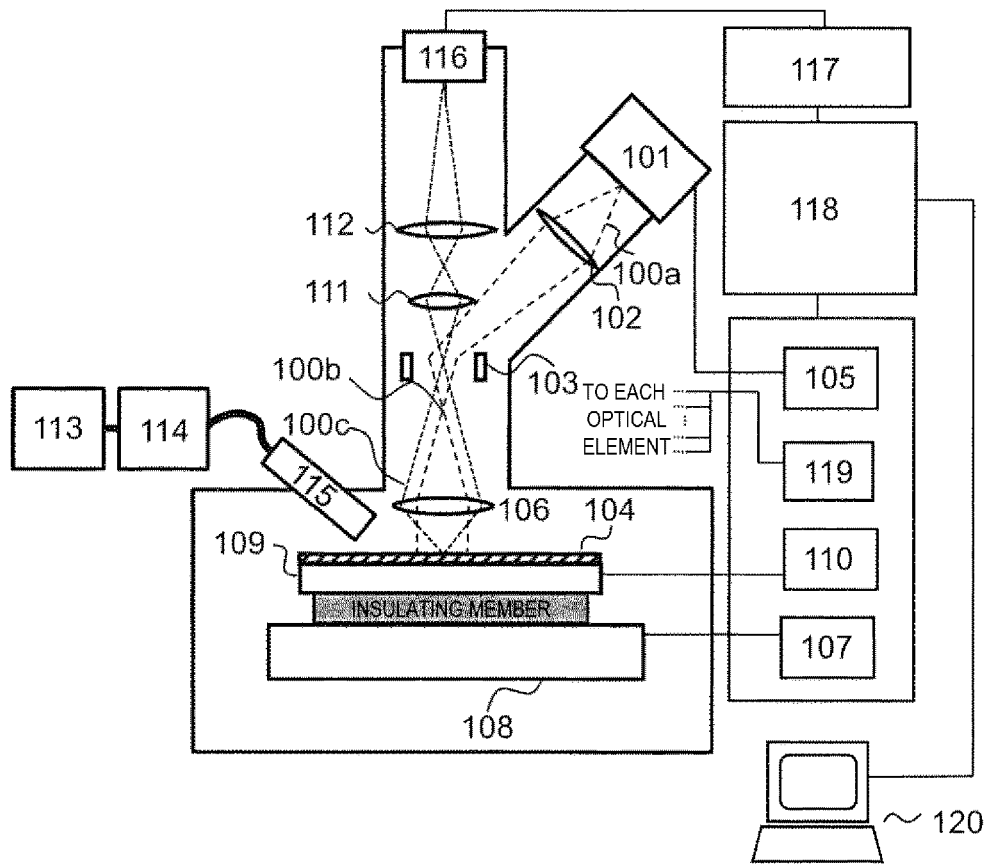
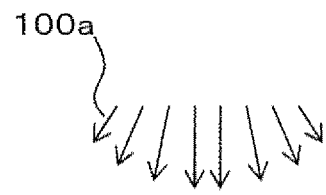
FIG. 2A
ELECTRON BEAMS ARE
NOT CONVERGED ON
BACK FOCAL POINT 100b
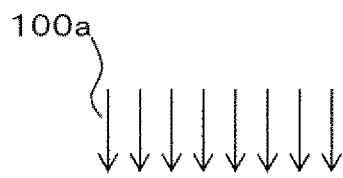
FIG. 2B
ELECTRON BEAMS ARE
CONVERGED ON
BACK FOCAL POINT 100b ELECTRON BEAMS ARE
NOT CONVERGED ON
BACK FOCAL POINT 100b ELECTRON BEAMS ARE
CONVERGED ON
BACK FOCAL POINT 100b ELECTRON BEAMS ARE
NOT CONVERGED ON
BACK FOCAL POINT 100b ELECTRON BEAMS ARE
CONVERGED ON
BACK FOCAL POINT 100b

[FIG. 5]
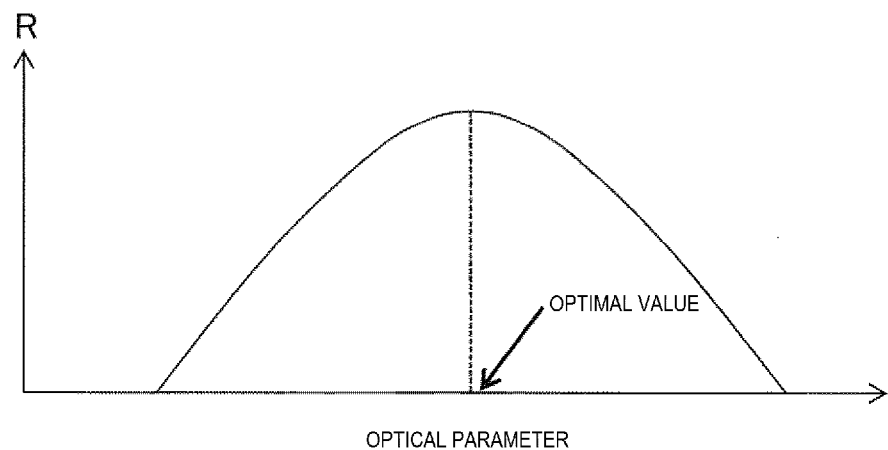
FIG. 6A
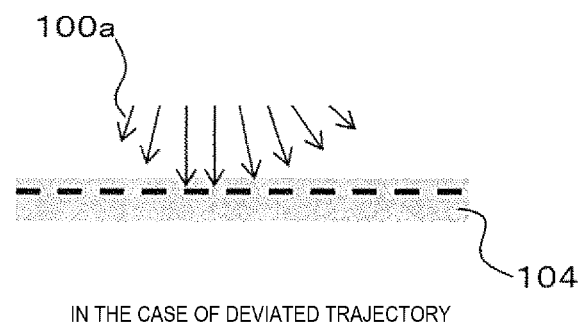
IN THE CASE OF DEVIATED TRAJECTORY
FIG. 6B
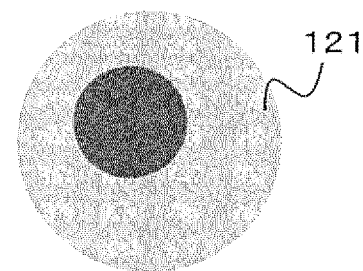
DARK PORTION GENERATED WHEN WAFER
POTENTIAL IS CHANGED TO POSITIVE

[FIG. 7]
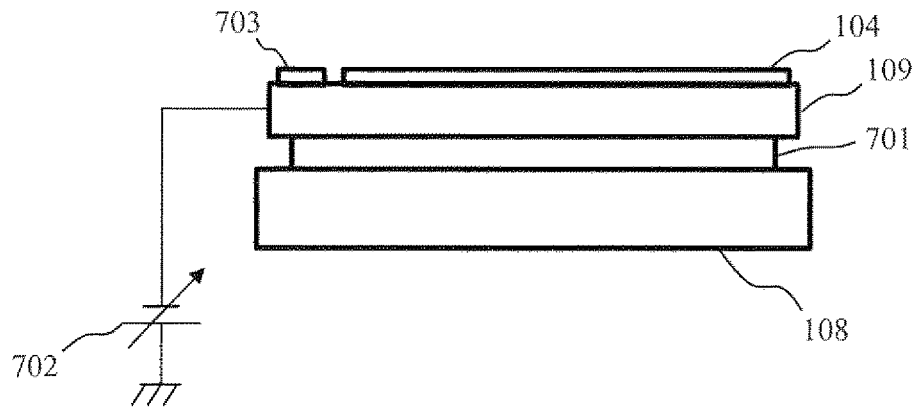
[FIG. 8]
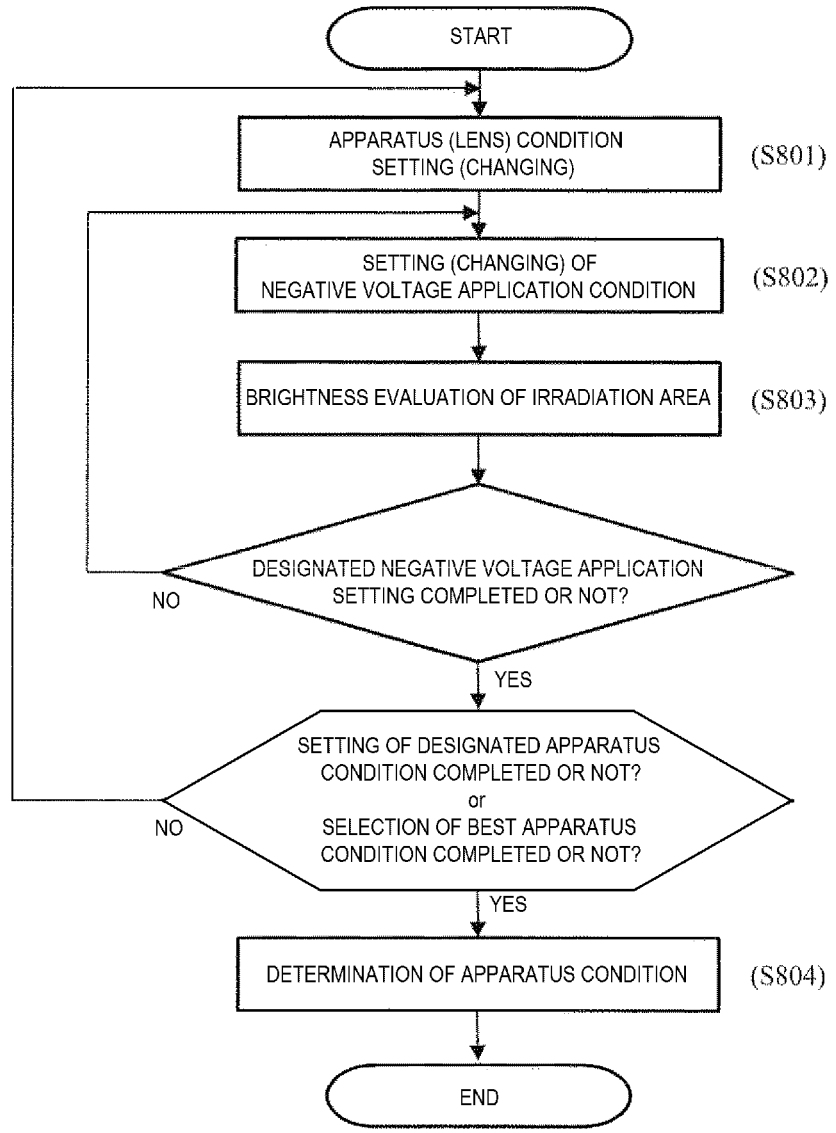

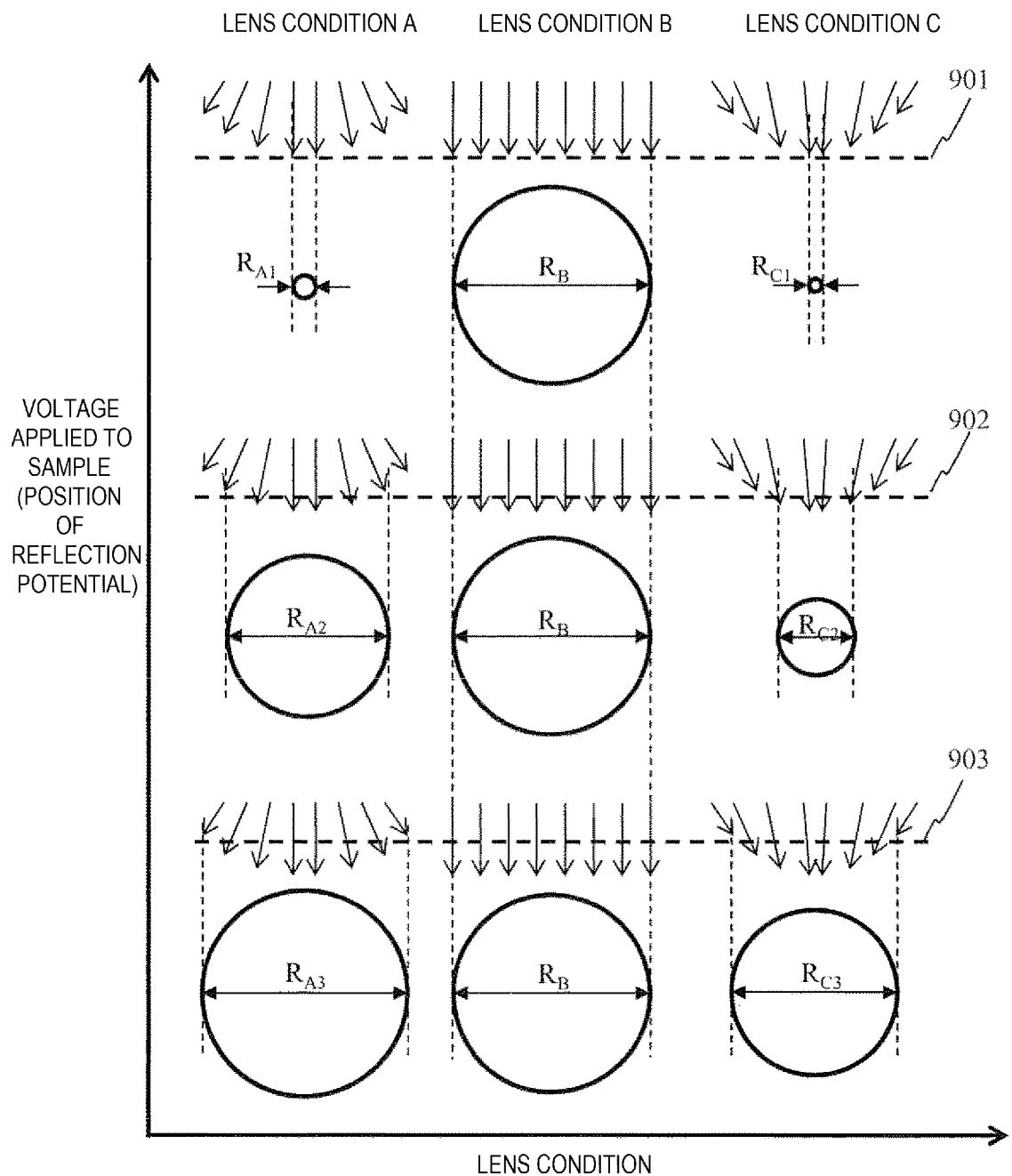

[FIG. 10]
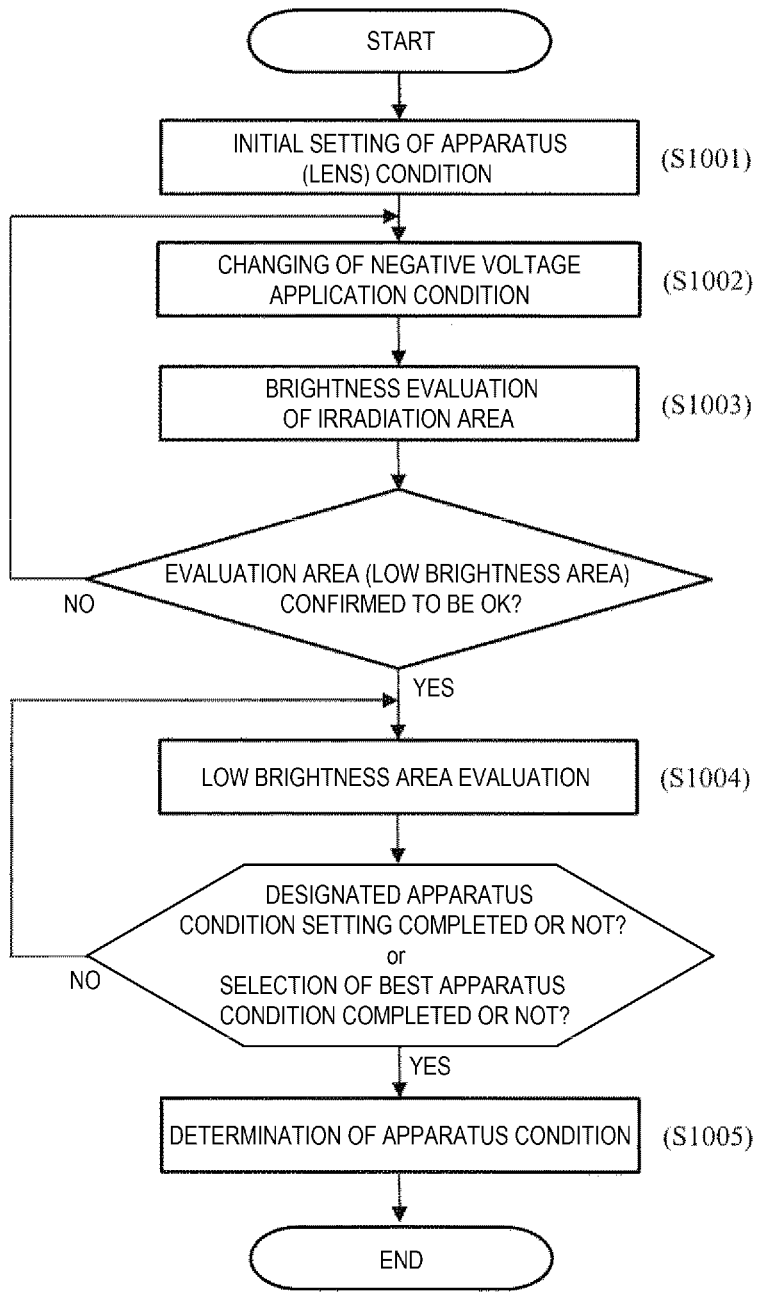

[FIG. 11]
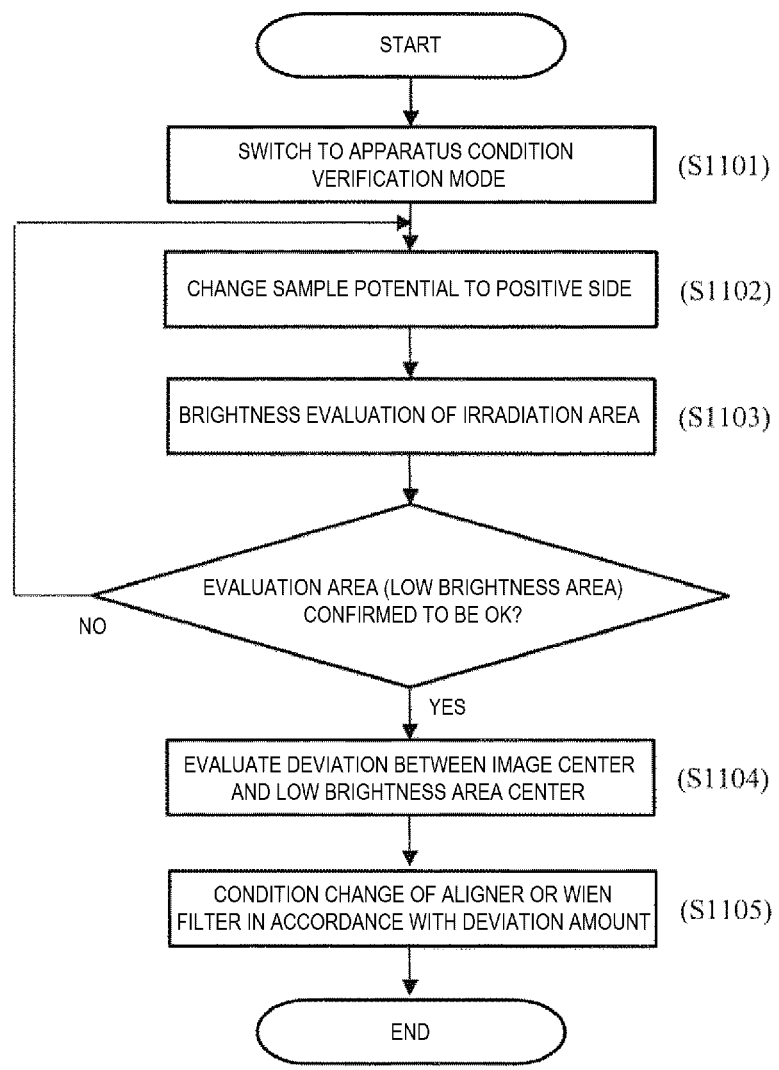

CHARGED PARTICLE BEAM APPARATUS, AND METHOD OF ADJUSTING CHARGED PARTICLE BEAM APPARATUS

TECHNICAL FIELD

The present invention relates to a charged particle beam apparatus used for defect inspection of a wafer, and particularly to a charged particle beam apparatus having a function of adjusting an irradiation condition of charged particle beams, and a method of adjusting the charged particle beam apparatus.

BACKGROUND ART

A charged particle beam apparatus such as an electron microscope is used as an apparatus for detecting a defect in a semiconductor wafer. Patent Literature 1 discloses a mirror electron microscope that determines the presence or absence of a defect by detecting a mirror electron generated when an electron beam is emitted perpendicularly to a sample surface. Further, Patent Literature 1 illustrates an electron microscope in which a relationship between parallelism of an electron beam emitted on the sample and a condition of a condenser lens is tabulated, and the lens condition is adjusted based on selection of the parallelism.

PRIOR ART LITERATURE

Patent Literature

Patent Literature 1: Japanese Patent NO. 4253576 (corresponding to U.S. Pat. No. 7,288,948)

SUMMARY OF INVENTION

Technical Problem

In a local charge state of a crystal defect by ultraviolet light irradiation disclosed in Patent Literature 1, a charged defect can be actualized by performing observation using a mirror electron microscope as disclosed in Patent Literature 1. However, there are various types of defects, and a charge amount is also different. In order to discriminate a defect due to a charge amount using a mirror electron microscope, it is necessary to reflect a contrast of a mirror electron image in accordance with a magnitude of the charge amount. According to an image formation principle of the mirror electron microscope, in order for the same charge amount to be reflected on an image as the same contrast over the entire field of view, an electron optical system needs to be adjusted such that the irradiation electron beam has a trajectory parallel to a wafer surface normal over the entire irradiation area. Even when there are defects having the same charge amount, if directions of the irradiation electron beams are not the same, the trajectory of the reflection is different, and thus different contrasts appear in the mirror electron image.

Meanwhile, as described in Patent Literature 1, although a beam with a high degree of parallelism to some extent can be formed by tabulating the apparatus condition in which the beam is parallel in advance, high reproducibility is required for a power supply that controls the lens. Since extremely high parallelism is required in order to perform identification of defects in response to slight changes in charge amount, it is desirable to confirm whether the beam is parallelly emitted with high accuracy, but Patent Literature 1 does not discuss a method of evaluating parallelism. As described above, although the adjustment of the trajectory of an irradiation electron beam is important in an inspection apparatus of the mirror electron microscope system, there is no means for measuring whether the trajectory is parallel to a normal direction of the wafer surface, which will depend on experience of an adjuster, and it is difficult to maintain high reproducibility. Therefore, based on the recognition that it is important to quantitatively perform trajectory adjustment or the like of the irradiation electron beam and to stably maintain the defect identification sensitivity performance, a charged particle beam apparatus is proposed below for a purpose of performing apparatus adjustment based on proper evaluation of a beam.

Solution to Problem

As an aspect of the present invention for achieving the abovementioned purpose, there is proposed is a charged particle beam apparatus including: an irradiation optical system including a lens which is configured to converge charged particle beams emitted from a charged particle source, an imaging optical system which is configured to image charged particles obtained by irradiating a sample with the charged particle beams on an imaging element, and a control apparatus configured to control the lens, and the control apparatus is configured to evaluate for each lens condition a size of a specific brightness area obtained by the charged particle beams being made to reach the sample, and to select a lens condition under which the size information fulfills a designated condition.

Further, as another aspect of the invention for achieving the abovementioned purpose, there is proposed a charged particle beam apparatus including: an irradiation optical system including an optical element which is configured to adjust charged particle beams emitted from a charged particle source, an imaging optical system which is configured to image charged particles obtained by irradiating a sample with the charged particle beams on an imaging element, an image processing apparatus which is configured to generate an image based on the charged particles detected by the imaging element, and a negative voltage application power supply which is configured to apply a negative voltage to the sample, and a control apparatus which is configured to control the negative voltage application power supply. The control apparatus is configured to control the negative voltage application power supply so as to switch the irradiation charged particle beams from the irradiation optical system between a state of being reflected without reaching the sample and a state of reaching the sample, and the control apparatus is configured to obtain at least one of a size and a position of a specific brightness area based on detection of the charged particles reaching the imaging element in a state in which the charged particle beams are switched to the state of reaching the sample, and to adjust the optical element such that at least one of the size and the position of the specific brightness area is a designated condition.

Further, as another aspect of the invention for achieving the abovementioned purpose, there is proposed a method of adjusting a charged particle beam apparatus including: an irradiation optical system including an optical element which is configured to adjust charged particle beams emitted from a charged particle source, and an imaging optical system which is configured to image charged particles obtained by irradiating a sample with the charged particle beams on an imaging element. The method of adjusting the charged particle beam apparatus includes: applying a negative voltage to the sample such that the charged particle beams are brought into a state of reaching the sample, detecting charged particles obtained in the negative voltage application state by the imaging element, generating an image that includes a specific brightness area that shows a reaching area of the charged particle beams based on the detection of the charged particles, and adjusting the optical element such that a size and a position of the specific brightness area contained in the image fulfill a designated condition.

Advantageous Effect

According to the above configuration, a trajectory of the charged particle beam which cannot be visually observed can be properly evaluated, and the apparatus condition can be adjusted properly.

BRIEF DESCRIPTION OF DRAWINGS

FIG. 1 is a diagram illustrating an outline of a mirror electron microscope inspection apparatus.

FIGS. 2A and 2B are diagrams illustrating an example in which a trajectory of a beam changes depending on an optical condition of an electron microscope.

FIG. 5 is a graph showing a relationship between a size of a specific brightness area and an optical condition.

FIGS. 6A and 6B are diagrams illustrating a state in which a projected beam and an ideal optical axis of the apparatus are not aligned with each other.

FIG. 7 is a diagram showing an example of a sample holder mounted with a standard sample for optical condition evaluation.

FIG. 8 is a flowchart showing steps of adjusting a lens condition based on image evaluation.

FIGS. 9A to 9C are diagrams showing a state in which obtained image information is changed by changing a voltage applied to the sample and the lens condition.

FIG. 10 is a flowchart showing steps of adjusting a lens condition based on image evaluation.

FIG. 11 is a flowchart showing steps of adjusting an apparatus condition based on image evaluation.

DESCRIPTION OF EMBODIMENTS

Figure 3A:
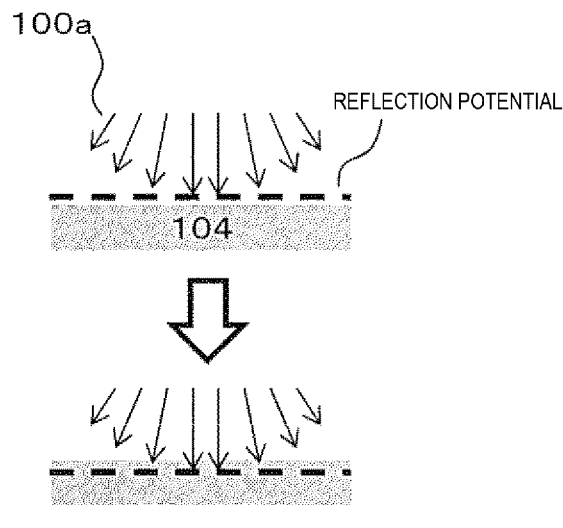
FIGS. 3A and 3B are diagrams illustrating an example in which a trajectory of a beam changes depending on an optical condition of an electron microscope.

In a semiconductor device manufacturing step, a fine circuit is formed on a semiconductor wafer polished in a mirror surface. When a particle, a scratch, or a crystal defect or a degraded region of a crystal exist on such a wafer, a defect or material deterioration occurs in the process of forming a circuit pattern, and the manufactured device may not operate normally, the reliability of the operation may deteriorate, or the product may not be completed.

In a case of a power device using SiC, SiC is excellent in various characteristics as a power device material, such as higher insulation breakdown voltage than Si. However, since the material is excellent in chemical stability and hard, it is difficult to process and polish a wafer surface without crystal disturbance, and it is difficult to completely remove the crystal degraded layer generated by processing. In addition, crystal defects such as dislocation are generated during crystal growth remain, and in order to ensure reliability of the SiC power device, it is necessary to manage these defects existed in the wafer.

One technique for defect inspection of a wafer is an electron beam apparatus that evaluates an image formed by detecting electrons obtained by irradiating a sample with charged particle beams. In the embodiments described below, a defect inspection apparatus that detects a defect based on an image signal obtained based on electron beam irradiation will be described mainly. For example, an inspection apparatus of a system to which a mirror electron microscope is applied will be described, in which a negative voltage substantially equal to an acceleration voltage of electron beams to be emitted is applied to a wafer, the electron beams irradiated to the entire inspection field of view on a wafer surface is reversed in a vicinity of the wafer surface, and the reversed electrons are imaged with an electron lens to obtain an electron image for inspection.

The mirror electron microscope is used for detection of a defect in a semiconductor crystal. Since the mirror electron image obtained in the state of being irradiated with ultraviolet light is suitable for stacking fault detection of a SiC epitaxial layer, it is desirable to provide an ultraviolet light source that irradiates the sample with ultraviolet light in the mirror electron microscope. A stacking fault portion of the SiC epitaxial layer captures charges generated inside the sample by the ultraviolet irradiation and is locally charged to distort an equipotential surface of the surface. Since shading is generated in a mirror electron image even with a slight equipotential surface distortion, the stacking fault can be detected with high sensitivity by using the mirror electron microscope.

In the embodiments to be described below, there is proposed a defect inspection apparatus which uses a standard sample having a flat surface made of a conductive material, measures distribution of image signal intensity in a field of view of the mirror electron image on the standard sample surface while changing a potential applied to the standard sample in a positive direction from a negative potential value at which all irradiation electrons are repelled, and adjusts the irradiation electron optical system based on the change of the image signal intensity distribution with respect to the applied potential.

According to the above configuration, the trajectory adjustment of the irradiation electron beam is determined quantitatively and reproducibly, and stable production of the defect inspection apparatus capable of maintaining the defect identification sensitivity performance is possible.

First Embodiment

An inspection apparatus using a mirror electron microscope will be described with reference to FIG. 1. However, an evacuation pump and a control apparatus thereof, an exhaustion system pipe, a transfer system for a wafer to be inspected, or the like are omitted in FIG. 1. Further, a trajectory of the electron beam is exaggerated relative to an actual trajectory for illustrative purpose.

First, a portion related to electron beam irradiation will be illustrated. Irradiation electron beams 100a emitted from an electron gun 101 are deflected by a separator 103 while being converged by a condenser lens 102, and are emitted as electron beams substantially parallel to a wafer 104 to be inspected. A Zr/O/W type Schottky electron source which can obtain a large current value with a small light source diameter is used in the electron gun 101. An electron source such as a LaB6 electron source which can obtain a higher current value or a cold cathode electron source having higher brightness may be used as well.

Further, the electron gun 101 may be a magnetic field immersion electron gun in which a magnetic lens is disposed in the vicinity of the electron source. A voltage and current necessary for the operation of the electron gun, such as an extraction voltage of the electron gun 101, an acceleration voltage of the extracted electron beam, and a heating current of an electron source filament, are supplied and controlled by an electron gun control apparatus 105. When the Schottky electron source or the cold cathode electron source is used as the electron source, since the inside of the electron gun 101 needs to be maintained at an ultrahigh vacuum, such as $10^{-6}$ Pa or less, a shield valve is provided for maintaining vacuum during maintenance or the like.

Although being depicted as one lens in the drawing, the condenser lens 102 may be an electron optical system in which a plurality of lenses and multipole elements are combined. An objective lens 106 is an electrostatic lens or a magnetic lens formed of a plurality of electrodes, or a combination thereof.

The separator 103 is installed to separate an irradiation electron beam toward a to-be-inspected wafer 104 and a mirror electron beam returned from the to-be-inspected wafer 104. In the present embodiment, a separator using an E×B deflector is used. The E×B deflector can be set to deflect the electron beam coming from above and cause the electron beam coming from below to go straight. In this case, an electron optical column that supplies the irradiation electron beam as shown in the drawing is inclined, and an electron optical column that images reflected electrons stands upright.

When it is necessary to correct aberration generated when the irradiation electron beams 100a are deflected by the separator, an aberration corrector may be additionally disposed. Further, when the separator 103 is a magnetic deflector, an auxiliary coil is provided and corrected. In addition to these optical elements, an alignment deflector that deflects the beams so as to make the beams pass therethrough along an ideal optical axis of a lens or the like may be mounted.

An area on the to-be-inspected wafer 104 irradiated by the irradiation electron beams 100a has an area of, for example, 10000 µm² or the like. The objective lens 106 includes an anode for pulling up the mirror electrons above the surface of the to-be-inspected wafer 104.

A wafer holder 109 is installed via an insulating member on a moving stage 108 controlled by a moving stage control apparatus 107, and the to-be-inspected wafer 104 is placed thereon. A driving method of the moving stage 108 is two orthogonal linear movements, a rotational movement around a center of the to-be-inspected wafer 104 and a linear movement in a radial direction of the wafer, or a combination thereof. In addition, a linear movement in an up-down direction or a tilting movement may be added. The moving stage 108 positions the entire or a part of the surface of the to-be-inspected wafer 104 on an electron beam irradiation position, that is, on an optical axis of the objective lens 106 by these movements.

In order to form a negative potential on the surface of the to-be-inspected wafer 104, a high voltage power supply 110 (negative voltage application power supply) applies a negative voltage substantially equal to the acceleration voltage of the electron beam to the wafer holder 109. The irradiation electron beams 100a are decelerated in front of the to-be-inspected wafer 104 by a deceleration electric field formed by the negative voltage applied to the wafer holder 109 (sample support member). The negative voltage applied to the wafer holder 109 is finely adjusted such that an electron trajectory is reversed in an opposite direction before colliding with the to-be-inspected wafer 104. The electrons reflected by the wafer are mirror electrons 100c.

The mirror electrons 100c are converged by the objective lens 106 or other imaging lenses, and are converted into image signals by being projected onto imaging elements. Since being an E×B deflector in the present embodiment, the separator 103 can be controlled so as not to have a deflecting action on the electron beams which travel from below, and the mirror electrons 100c go straight in an upright imaging system column direction, and a first image is sequentially imaged by an intermediate electron lens 111 and a projection electron lens 112.

The intermediate lens 111 and the projection lens 112 are electrostatic or magnetic lenses. A final electron image is enlarged and projected by an image detection unit 113. Although being depicted as one electron lens in FIG. 1, the projection electronic lens 112 may also be constituted by a plurality of electron lenses and multipole elements for high magnification enlargement and correction of image distortion. Although not shown in the drawing, a deflector and an astigmatism corrector for adjusting the electron beams in more detail are provided as necessary.

An ultraviolet light from an ultraviolet light source 113 is dispersed by a spectroscope 114, and is projected onto the to-be-inspected wafer 104 by an ultraviolet optical element 115. Since the to-be-inspected wafer 104 is held in vacuum, an atmosphere side and a vacuum side are defined by a window made of a material (for example, quartz) that transmits ultraviolet light, and the ultraviolet light emitted from the ultraviolet optical element 115 passes through the window. Alternatively, the ultraviolet light source 113 may be installed in vacuum. In this case, it is also possible to use a solid-state element that emits ultraviolet light having a specific emission wavelength, instead of wavelength selection by the spectroscope 114. The ultraviolet light is transmitted between the ultraviolet light source 113, the spectroscope 114, and the ultraviolet optical element 115 by an optical fiber or the like. Alternatively, the ultraviolet light source 113 and the spectroscope 114 may be integrated. In addition, when the ultraviolet light source 113 can be provided with a filter that transmits only wavelengths in a specific range, the spectroscope 114 may not be used.

The image detection unit 116 (imaging element) converts an image of the mirror electrons 100c into an electric signal and sends the signal to a defect determination unit 117. The image detection unit 116 may be constituted by a fluorescent plate that converts the electron beams into visible light, and a camera that images an electron image of the fluorescent plate as an example, and constituted by a two-dimensional detector such as a CCD element that detects electrons as another example, or the like. A mechanism for multiplying the intensity of the electron image or the intensity of the fluorescence may be provided. The defect determination unit 117 functions as an image processing apparatus and executes image processing as to be described below.

The mirror electron images at each location on the surface of the wafer 104 are output from the image detection unit 116 while the moving stage 108 is driven. The moving stage 108 may stop during each imaging, or may continue moving while maintaining a constant speed without stopping. In the latter case, the image detection unit 116 performs Time Delay Integration (TDI) imaging. Although it is not necessary to sequentially stop the moving stage 108 in each imaging and a high speed inspection operation can be performed, it is necessary to synchronize a moving speed of the moving stage 108 and a signal transfer speed (line rate) of the imaging element. It is not necessary to sequentially stop the moving stage 108 in each imaging and a high speed inspection operation can be performed though it is necessary to synchronize a moving speed of the moving stage 108 and a signal transfer speed (line rate) of the imaging element.

The operation conditions of various parts of the apparatus including the condition of the abovementioned TDI imaging operation are provided by an inspection apparatus control unit 118. Various conditions such as an acceleration voltage when electron beams are generated, an electron beam deflection width and a deflection speed, a stage moving speed, image signal acquisition timing from the image detection element, ultraviolet irradiation conditions, or the like are input in advance to the inspection apparatus control unit 118, and the moving stage control apparatus 107, an electron optical system control apparatus 119 that controls each electron optical element, the control system of the ultraviolet light source 113 and the spectroscope 114, or the like are comprehensively controlled. The inspection apparatus control unit 118 may be constituted by a plurality of computers that share roles and are coupled by a communication line. Further, the monitor-equipped input and output apparatus 120 is installed, and adjustment of the inspection apparatus, input of an operation condition, execution of inspection, or the like can be performed by a user. Further, an operation program for operating each of the control units (control apparatus) is stored in advance in a storage medium (not shown), and the control is performed in accordance with an instruction command.

In order that the inspection apparatus of the mirror electron microscope system described above can correctly detect and classify defects in the wafer, the electron optical system needs to be correctly adjusted. Particularly important adjustment is to perform irradiation such that the irradiation electron beams 100a has a trajectory parallel to the surface normal of the to-be-inspected wafer 104, which is realized by converging the irradiation electron beams 100a to a back focal point 100b of the objective lens 106 by the condenser lens 102. Since a position of the back focal point 100b changes depending on the operation condition of the objective lens 106, and the fluorescent plate or the like cannot be installed due to that each pole of the separator 103 or the objective lens 106 exists, it is not possible to directly observe whether the electron beams are converged at the position of the back focal point 100b.

Therefore, in the present embodiment, by changing an output voltage of the high voltage power supply 110 that applies a negative potential to the wafer 104, a convergence condition of the electron beams to the back focal point 100b is indirectly observed.

The wafer 104 is a sample in which a metal such as platinum or gold that does not form an oxide film is coated by a method such as vacuum evaporation. The sample has an area in which no pattern is formed or an area having no pattern in a range larger than an electron beam irradiation area. The sample is, for example, a Si wafer. The wafer may be made of any material as long as the wafer is conducted with the wafer holder 109 and has a flat surface. For example, the wafer may be a quartz glass wafer having a metal coating on the surface including a back surface and a side surface.

FIG. 2 is a diagram showing an example in a case where the electron beams from the condenser lens 102 are not converged to the back focal point 100b of the objective lens 106 (FIG. 2(a)) and a case where the electron beams are converged (FIG. 2(b)). In FIG. 2, the electron trajectories in the vicinity of the wafer 104 are schematically illustrated as viewed from the side. For the sake of illustration, the inclination of each trajectory or the like is exaggerated. When the electron beams are not converged on the back focal point 100b, as shown in FIG. 2(a), the trajectories of the irradiation electron beams 100a are not parallel to the surface normal of the wafer 104 except those on the optical axis. Meanwhile, when the electron beams are converged on the back focal point 100b, as shown in FIG. 2(b), the trajectories of the irradiation electron beams 100a are substantially parallel to the surface normal of the wafer 104. Therefore, among the kinetic energy of the irradiation electron beams, a component in the normal direction of the surface of the wafer 104 is smaller from a center of the irradiation area toward the outside in the example of FIG. 2(a), and is substantially equal over the entire irradiation area in the case of FIG. 2(b).

Under these conditions, the negative potential applied to the wafer 104 is changed. FIG. 3 schematically shows a state in which a potential of the wafer 104 is changed. An upper view of FIG. 3(a) (above the white arrow) is a state in which a surface potential of the wafer 104 is adjusted such that a central portion of the irradiation electron beams 100b is reversed on the trajectory thereof in the vicinity of the wafer surface when the electron beams are not converged to the back focal point 100b. A dotted line shows a position of an equipotential surface of a reflection potential set by application of the negative voltage. The electron beams at the central portion reach the reflection potential position for being parallel to the surface normal of the wafer. However, since the electrons in a peripheral portion have a lateral kinetic energy component, trajectories thereof are reversed before reaching the set reflection potential (the reversed trajectories are not shown).

A lower view of FIG. 3(a) (under the white arrow) shows a case where the potential of the wafer is further changed to a positive side while the sample potential is kept negative, and the potential at which the electron beams at the central portion are reversed on trajectories thereof is lower than the wafer surface (inside the wafer). At this time, electrons in the central portion of the electron beam irradiation area collide with the wafer surface. Since the wafer is conductive and is conducted (grounded) with the wafer holder 109, the colliding electrons flow toward the wafer holder 109 and are lost, and thus the mirror electrons are eliminated. Meanwhile, electrons on the outside having a small component in the normal direction of the wafer surface are reversed on trajectories thereof without colliding with the surface.

Figure 3B:
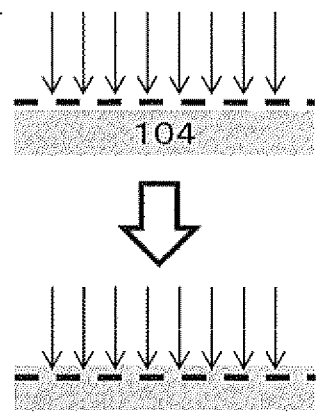

Meanwhile, the upper view of FIG. 3(b) (above the white arrow) is a state in which a surface potential of the wafer 104 is adjusted such that the irradiation electron beams 100b are reversed on trajectories thereof in the vicinity of the wafer surface when the electron beams are converged to the back focal point 100b. In this case, since all the electron beams are substantially parallel to the normal direction of the wafer, the wafer normal components of the kinetic energy of the electrons are substantially the same, and all the electrons reach the set reflection potential position and trajectories thereof are reversed (reversed trajectories are not shown).

The lower view (under the white arrow) shows a case where the potential of the wafer is further changed to the positive side, and the potential to reverse the trajectory is lower than the wafer surface (inside the wafer). At this time, the electrons collide with the wafer surface over the entire surface of the irradiation area, but not a part of the irradiation electron beams as shown in FIG. 3(a).

Figure 4A:
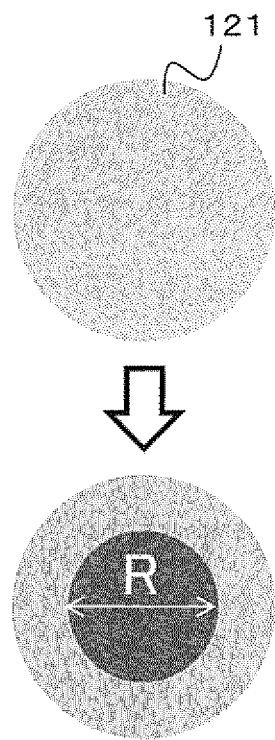
FIGS. 4A and 4B are diagrams illustrating an example in which a size of a specific brightness area changes depending on an optical condition of an electron microscope.
Figure 4B:
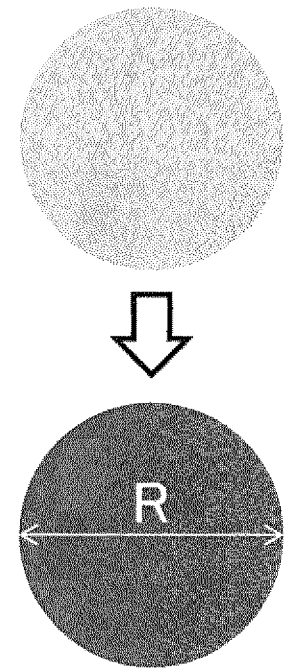

The abovementioned state is shown in FIG. 4 as a schematic view of a field of view of the mirror electron image. In FIG. 4 (a) in which the electron beams are not converged to the back focal point 100b, when the potential of the wafer is changed to positive as described above, a portion that collides with the wafer surface is dark among the brightness of the entire field of view of the mirror electron image (change as from upper to lower of the white arrow). Meanwhile, in FIG. 4(b) in which the electron beams are converged to the back focal point 100b, when the potential of the wafer is changed to positive, the entire field of view of the mirror electron image is dark due to a collision with the wafer surface (change as from upper to lower of the white arrow).

A size of the dark area when the wafer potential is changed to positive is noted by R in FIG. 4. A value of the size R may be determined as a size of a range of the image intensity smaller than a threshold value when a constant threshold value is set for the image intensity of the mirror electron image. For example, the size is evaluated by counting the number of pixels in a low brightness area equal to or less than a designated threshold (a pixel area equal to or less than a designated gradation value).

In the present embodiment, the size R of the dark area is used as an evaluation index, and it is determined whether the optical system is adjusted such that the electron beams from the condenser lens 102 are converged to the back focal point 100b of the objective lens 106.

FIG. 5 shows an example of a graph for the determination. An optical parameter is taken in a horizontal axis. For example, the optical parameter includes lens conditions such as a voltage to be applied to the objective lens 106 or a current value to be applied to the condenser lens 102 (when the condenser lens 102 is a magnetic lens). For each optical parameter value, the size R of the dark area in the mirror electron image when the voltage of the wafer 104 is positive by a constant amount is plotted. When the dark size is not a circle, an index is determined as a radius of a circle that circumscribes the dark area. FIG. 4 shows a change of the point plotted in this way, and the value R takes a maximum value for a certain optical parameter value. An optical parameter which makes R to be the maximum or exceed a designated value is set as an optimal value. At this time, adjustment close to the condition of FIG. 4(b) is achieved, in which electron beams are converged on the back focal point 100b of the objective lens 106 and the irradiation electron beams are emitted parallel to the normal direction of the wafer surface.

Further, in an example in which the optical parameter in FIG. 5 is set to the voltage value of the objective lens 106, a graph is created repeatedly for other parameters, such as a plurality of current values of the condenser lens 102, and a combination of the voltage value of the objective lens 106 and the current value of the condenser lens 102 which give the largest R is selected as an optimal value. Thereby, it is possible to determine the optimal value for the plurality of optical parameters as described above.

If a ratio of the maximum value of R determined in this way to the size of the field of view of the mirror electron image is calculated, and the ratio is used as an index of irradiation parallelism of the irradiation electron beams, the condition of electron beam irradiation in each apparatus can be quantitatively shown.

An adjustment method using the wafer 104 is shown in the present embodiment above. Other conductive samples having a flat surface are also included in the invention. For example, a sample piece may be installed at a location where the wafer on the wafer holder 109 is not placed. For example, as illustrated in FIG. 7, at a position different from the mounting position of the wafer 104 of the wafer holder 109 mounted on the moving stage 108 via the insulating member 701, a dedicated sample 703 conducted to the wafer holder 109 to which a negative voltage is applied from a negative voltage application power supply 702 so as to have the same potential as the wafer 104 may be used to perform the above adjustment.

According to the present embodiment, in an inspection apparatus using a mirror electron microscope, a situation in which the irradiation electron beams are emitted in parallel with the normal direction of the wafer surface can be quantitatively evaluated without setting an electron image observation device on a plane of the back focal point of the objective lens.

Although the abovementioned example of selecting a lens condition in which the size information of the low brightness area appearing when the sample potential is changed by a constant amount fulfills a designated condition (area is the maximum or equal to or greater than a designated value) from the plurality of lens conditions has been described, an amount of change of the area in accordance with the change of the sample potential can be used as a determination index instead of an absolute amount of the area. FIG. 8 is a flowchart showing the step. A control apparatus attached to the apparatus includes a storage medium storing a program for operating the apparatus in accordance with a flowchart which will be described below, and can perform automatic adjustment of the apparatus in the apparatus as illustrated in FIG. 1.

In the automatic adjustment step illustrated in FIG. 8, first, the lens condition is set to an initial value (step 801). Then, in a state in which a designated negative voltage is applied to the sample (step 802), an image is generated by projecting the beams towards the sample to perform a brightness evaluation in the image (step 803). In this case, pixels having a brightness value (gray level) equal to or less than a designated value are counted, and an area of the low brightness area is evaluated. By performing such an area evaluation under a plurality of sample potential conditions, a change in the area of the low brightness area in accordance with the change in the sample potential under a certain lens condition is evaluated. FIG. 9 is a diagram showing a state in which the size of a low brightness area 908 obtained under a plurality of lens conditions (three lens conditions (a) to (c) in this example) changes according to a change of the voltage applied to the sample. A state in which a sample height (depth) at which the projected electrons reach is changed from positions 901 to 903 due to a change in the voltage applied to the sample.

In cases of a lens condition A (lens condition is weaker than an ideal value) and a lens condition C (lens condition is stronger than the ideal value), if the voltage application condition to the sample is changed, the size of the low brightness area changes from $R_{A1}$ to $R_{A3}$, $R_{C1}$ to $R_{C3}$, respectively. Meanwhile, in a case of a lens condition B, since the lens condition is properly set and the beams are projected from the normal direction of the sample surface, a size of a low brightness area $R_B$ does not change even if the voltage applied to the sample is changed. In the method illustrated in FIG. 8, the size of the low brightness area at different sample potentials is obtained for each lens condition, and a lens condition under which the change in the size of the low brightness area is smallest is set as an apparatus condition (step 804).

Thus, it is possible to set an appropriate lens condition by finding the lens condition under which the size of the low brightness area does not change.

FIG. 10 is a flowchart showing steps of evaluating the size of the low brightness area by changing the lens conditions after first determining the sample potential for evaluating the low brightness area. As illustrated in FIG. 5, since the lens condition under which the size of the low brightness area is the largest (or equal to or greater than a designated value) is an appropriate lens condition, electrons are firstly allowed to reach the sample to such an extent that the size of the low brightness area can be evaluated, and then the size of the low brightness area is evaluated while changing the lens condition. Therefore, after an initial value of the lens condition (step 1001) is set, brightness evaluation (step 1003) of the irradiation area is performed while changing the voltage condition to the sample (step 1002), and whether the size of the low brightness area has a size sufficient for high accuracy evaluation is evaluated. When the size of the low brightness area is small or when the electrons do not reach the sample sufficiently and image recognition of the low brightness area is difficult, proper evaluation cannot be performed, so that the negative voltage is gradually changed to the positive side to generate a low brightness area of a suitable size, and the lens condition is changed in that state (step 1004). Then, a lens condition under which the size of the low brightness area fulfills a designated condition is found (step 1004), and the lens condition is determined as an apparatus condition (step 1005). A best condition may be found after setting a designated number of lens conditions, or the automatic adjustment may be completed when the best condition is determined. Further, a lens condition under which the size of the low brightness area can be regarded as the largest by interpolation may be selected.

Generally, a beam evaluation mode by causing electrons to partially reach the sample is provided in an apparatus that generates an image in a state in which the electrons do not reach the sample, so that inspection or the like can be performed under proper beam conditions.

Second Embodiment

When the electron beams are not on the optical axis of the objective lens 106 even if the electron beams are converged on the plane of the back focal point 100*b* of the objective lens 106 by the condenser lens 102, an inclination of the trajectory deviates as shown in FIG. 6(*a*). In this case, when the potential of the wafer is changed to positive to cause a part of the electron beams to collide with the surface, the dark portion of the field of view of the mirror electron image deviates from the center of the field of view as shown in FIG. 6(*b*). If axis alignment of the irradiation electron optical system including the electron gun 101 and the separator 103 is performed such that the position deviation disappears and the center of the field of view is dark, a situation can be realized in which the electron beams from the condenser lens 102 is correctly converged on the optical axis of the objective lens 106.

After the electron beams pass through the optical axis of the objective lens by the above adjustment, a degree of convergence to a plane of the back focal point 100*b* of the objective lens 106 may be adjusted in accordance with the first embodiment. According to the present embodiment, the axis adjustment of the irradiation electron optical system including the separator can be performed without providing the electron image observation device on the plane of the back focal point of the objective lens.

FIG. 11 is a flowchart showing steps of adjusting the apparatus condition based on evaluation of inclination of the trajectories of the beams. First, by switching to an apparatus condition verification mode, an apparatus condition is set in which electrons can reach the sample (step 1101). Next, the sample potential is changed to the positive side while maintaining the negative potential state of the sample, and then brightness evaluation of the irradiation area is performed (steps 1102 and 1103). Steps 1102 and 1103 are repeated until an image that allows the size evaluation of the low brightness area is obtained. Once the low brightness area of a designated size appears in the image, deviation between an image center and a low brightness area center is then evaluated (step 1104). As a method for specifying the low brightness area center, it is conceivable to obtain the center by specifying a boundary between the low brightness area and a high brightness area and creating a distance image or the like. Further, it is also possible to adopt a general method for specifying a centroid position.

The optical axis adjustment is executed to correct a deviation amount (step 1105). In order to correct the deviation, for example, an aligner (deflector) for performing axis adjustment with respect to the objective lens optical axis may be provided, adjustment may be performed by referring to a table in which a relationship between the deviation amount and a aligner condition is stored in advance, or the axial adjustment may be performed by optimizing a Wien condition of the separator 103.

Usually, an adjustment mode (second irradiation mode) for causing the electrons to reach the sample is provided in an apparatus that generates an image in a state (first irradiation mode) in which electrons do not reach the sample, and thus a proper apparatus condition can be found. When performing the adjustment of the apparatus condition during or after the inspection of an actual sample, the moving stage control apparatus 107 controls the moving stage 108 such that the electron beams are emitted to the standard sample 703 or an area on the wafer defined for the adjustment of the apparatus condition as illustrated in FIG. 7, and the high voltage power supply 110 changes the negative voltage applied to the wafer holder 109 during inspection to the positive side such that the irradiation electron beams 100*a* reach the wafer or the standard sample. In a state that the beams reach the wafer, it is possible to perform proper beam evaluation and adjustment by performing the abovementioned image evaluation and adjustment of the apparatus condition.

An operation program (recipe) may be prepared in advance so as to cause switching of the abovementioned irradiation mode to be switched to the second irradiation mode after a designated time has elapsed since the start of the apparatus or the start of the inspection, or the switching may be performed based on an instruction of the apparatus condition adjustment from the monitor-equipped input and output apparatus 120.

REFERENCE SIGN LIST

100*a* irradiation electron beam
100*b* back focal point
100*c* mirror electron beam
101 electron gun
102 condenser lens
103 separator
104 to-be-inspected wafer
105 electron gun control apparatus
106 objective lens 107 moving stage control apparatus
108 moving stage
109 wafer holder
110 high voltage power supply
111 intermediate electron lens
112 projection electron lens
113 ultraviolet light source
114 spectrometer
115 ultraviolet optical element
116 image detection unit
117 defect determination unit
118 inspection apparatus control unit
119 electron optical system control apparatus
120 monitor-equipped user interface apparatus
121 mirror electron image

The invention claimed is:

1. A charged particle beam apparatus comprising:
an irradiation optical system including a lens which is configured to converge charged particle beams emitted from a charged particle source;
an imaging optical system which is configured to image charged particles obtained by irradiating a sample with the charged particle beams on an imaging element; and
a control apparatus which is configured to control the lens, wherein
the control apparatus is configured to use a first image obtained by orbital reversal of the charged particle beam on the trajectory thereof in the vicinity of the wafer surface, and a second image obtained by making the charged particle beam reach the wafer, and to evaluate for each lens condition a size of a brightness area in the second image reduced by a certain amount with respect to brightness of the first image, and to select a lens condition under which the size information fulfills a designated condition.

2. The charged particle beam apparatus according to claim 1, further comprising:
a negative voltage application power supply which is configured to apply a negative voltage to the sample, wherein
the control apparatus is configured to control the negative voltage application power supply so as to switch the irradiation charged particle beams from the irradiation optical system between a state of being reflected without reaching the sample and a state of reaching the sample, and the control apparatus is configured to select a lens condition under which the size of the specific brightness area appearing in a state in which the charged particle beams are switched to the state of reaching the sample fulfills a designated condition.

3. The charged particle beam apparatus according to claim 1, wherein
the control apparatus is configured to select a lens condition under which the size of the specific area is maximum or equal to or greater than a designated value.

4. The charged particle beam apparatus according to claim 3, further comprising:
a negative voltage application power supply which is configured to apply a negative voltage to the sample, wherein
the control apparatus is configured to select a lens condition under which the size of the specific area when the negative voltage applied to the sample from the negative voltage application power supply is changed to a positive side is maximum or equal to or greater than the designated value.

5. The charged particle beam apparatus according to claim 1, further comprising:
a negative voltage application power supply which is configured to apply a negative voltage to the sample, wherein
the control apparatus is configured to set the lens to a plurality of conditions, and to obtain a change in the size of the specific brightness area when the voltage applied to the sample is changed under each of the plurality of conditions.

6. The charged particle beam apparatus according to claim 5, wherein
the control apparatus is configured to select a lens condition under which the change in the size of the specific brightness area is minimum or equal to or greater than a designated value.

7. A charged particle beam apparatus comprising:
an irradiation optical system including an optical element which is configured to adjust charged particle beams emitted from a charged particle source;
an imaging optical system which is configured to image charged particles obtained by irradiating a sample with the charged particle beams on an imaging element;
an image processing apparatus which is configured to generate an image based on the charged particles detected by the imaging element;
a negative voltage application power supply which is configured to apply a negative voltage to the sample; and
a control apparatus which is configured to control the negative voltage application power supply, wherein
the control apparatus is configured to control the negative voltage application power supply so as to switch the irradiation charged particle beams from the irradiation optical system between a state of being reflected without reaching the sample and a state of reaching the sample, and
the control apparatus is also configured to use a first image obtained by orbital reversal of the charged particle beam on the trajectory thereof in the vicinity of the wafer surface, and a second image obtained by making the charged particle beam reach the wafer, and to evaluate for each lens condition at least one of the size and position of a brightness area in the second image reduced by a certain amount with respect to brightness of the first image, and to select a lens condition under which the at least one of the size and position of brightness information fulfills a designated condition.

8. The charged particle beam apparatus according to claim 7, wherein
the control apparatus is configured to control the optical element such that a center of the specific brightness area coincides with a center of the image generated by the image processing apparatus.

9. A method of adjusting a charged particle beam apparatus including: an irradiation optical system including an optical element which is configured to adjust charged particle beams emitted from a charged particle source, and an imaging optical system which is configured to image on an imaging element charged particles obtained by irradiating a sample with the charged particle beams, the method comprising:
applying a negative voltage to the sample such that the charged particle beams are brought into a state of reaching the sample;
detecting charged particles obtained in the negative voltage application state by the imaging element;

generating an image including a specific brightness area that shows a reaching area of the charged particle beams based on the detection of the charged particles;

adjusting the optical element such that a size and a position of the specific brightness area contained in the image fulfill a designated condition; and using first image obtained by orbital reversal of the charged particle beam on the trajectory thereof in the vicinity of the wafer surface, and a second image obtained by making the charged particle beam reach the wafer, and to evaluate for each lens condition at least one of the size and position of a brightness area in the second image reduced by a certain amount with respect to brightness of the first image, and to select a lens condition under which the at least one of the size and position of information fulfills a designated condition.

10. The method of adjusting a charged particle beam apparatus according to claim 9, wherein the optical element is a lens, and a lens condition is adjusted such that the size of the specific brightness area is the largest or is a size equal to or greater than a designated value.

11. The method of adjusting a charged particle beam apparatus according to claim 9, wherein the optical element is a deflector which is configured to perform axis alignment of the charged particle beams with an ideal optical axis of a lens that converges the charged particle beams, and the deflector is adjusted such that a center of the specific brightness area coincides with a center of the image.

* * * * *